United States Patent
Munoz-Bustamante

[19]
[11] Patent Number: 6,088,756
[45] Date of Patent: Jul. 11, 2000

[54] FIVE STATE BUS DRIVER HAVING BOTH VOLTAGE AND CURRENT SOURCE MODES OF OPERATION

[75] Inventor: Carlos Munoz-Bustamante, Durham, N.C.

[73] Assignee: International Business Machines Corporation, Armonk, N.Y.

[21] Appl. No.: 09/162,618

[22] Filed: Sep. 29, 1998

[51] Int. Cl.[7] .............................. G06F 13/00; G06F 13/40; H03K 19/0175

[52] U.S. Cl. .............................. 710/129; 710/100; 326/56

[58] Field of Search ..................................... 710/129, 100; 709/301; 714/735; 340/653, 657; 326/56, 38, 62, 90

[56] References Cited

U.S. PATENT DOCUMENTS

| | | |
|---|---|---|
| 4,082,964 | 4/1978 | Gies . |
| 4,771,428 | 9/1988 | Acuff et al. . |
| 5,381,059 | 1/1995 | Douglas . |
| 5,804,985 | 9/1998 | Shieh et al. . |
| 5,941,997 | 8/1999 | Greaves . |

Primary Examiner—Gopal C. Ray
Attorney, Agent, or Firm—Martin J. McKinley

[57] ABSTRACT

A driver circuit includes both a conventional three state mode of operation and a five state operating mode. In the three state mode of operation, the output of the driver can be in logical 0 or logical 1 "voltage source" states, as well as a very high impedance state. In addition to these three states, the output of the driver in the five state mode of operation can also be in logical 1 and logical 0 "current source" states. The voltage source states are characterized by low output impedance (e.g., 30 Ohms), while the current source states are characterized by higher output impedance (e.g., 600 Ohms). The driver circuit is particularly useful for eliminating turnaround cycles on a multiplexed address/data bus. When coupled to such a bus, the clock line is used to select the voltage source mode during the first half of the clock cycle, and the current source mode during the last half of the clock cycle. Thus, two drivers that are coupled to the same line of the bus are prevented from being switched ON in the voltage source mode at the same time, which could otherwise occur momentarily during the transition from one clock cycle to the next.

7 Claims, 1 Drawing Sheet

FIVE STATE BUS DRIVER HAVING BOTH VOLTAGE AND CURRENT SOURCE MODES OF OPERATION

BACKGROUND OF THE INVENTION

This invention pertains to computer systems and other information handling systems and, more particularly, to a bus driver circuit that has five output states including both voltage and current source modes of operation, and that is suitable for use in eliminating "turnaround cycles" or "wait cycles" on a bus.

In the design of computer buses, the reduction in the total number of signal lines is frequently an important criterion. From a mechanical design standpoint, reducing the total number of lines also reduces the total number of pins for any connector that is coupled to the bus. One way to reduce the total number of lines is to "time multiplex" the address and data signals such that there is only one set of "address/data" lines that carry both address and data information, but at different times. In other words, during certain intervals of time address information is transmitted over the address/data lines, while data is transmitted over these same lines during other intervals of time.

One such industry standard bus is the Peripheral Component Interconnect bus or PCI bus. On the PCI bus, 32 bits of address information and 32 bits of data are transmitted over the same 32 address/data lines. If the PCI bus did not use time multiplexing, a total of 64 lines would be needed just to carry the address and data information. Consequently, for PCI, the use of time multiplexing for the address and data signals reduces the total number of signal lines by 32, which also reduces the bus connector "pin count" by the same amount. Consequently, when compared to other competing buses that do not multiplex the address and data signals, the PCI bus has about half the total number of signal lines.

Since two or more devices can drive the bus, electrical contention problems can result. These contention problems are caused by the first device's failure to relinquish the bus before the second device takes over. Consequently, for a brief interval of time, two bus driver circuits coupled to the same line on the bus may be simultaneously attempting to drive that line to two different logic levels. These contention problems become more acute with increased bus speeds.

To alleviate this electrical contention problem, it is common in the industry to have "turnaround cycles" or "wait cycles" allocated between the time when one device is driving the bus and the time when another device takes over. The disadvantage to the insertion of turnaround cycles, however, is that they decrease data throughput. For example, on the PCI bus, turnaround cycles reduce the data throughput by 50% for all non-burst mode read cycles, and for non-burst mode write cycles involving either a change of initiator or target device the throughput is reduced by 33%.

The term "back-to-back write" or "back-to-back read" refers to two or more consecutive data transfer operations (i.e., read or write operations) in non-burst mode between the same initiator device and the same target device, with or without turnaround cycles. For non-burst mode data transfers, address information is transmitted over the bus at the beginning of each individual data transfer operation. For burst mode data transfers, however, consecutive data transfer operations are read from or written to consecutive address locations so that the base address information is only transmitted once at the beginning of each burst of data. The term "conventional back-to-back transfer" refers to a back-to-back transfer that includes turnaround cycles, while the term "fast back-to-back transfer" refers to a back-to-back transfer in which turnaround cycles have been eliminated.

One method for the elimination of turnaround cycles for back-to-back write operations is described in U.S. Pat. No. 5,448,703. According to this patent, a PCI initiator uses address range checking hardware to detect that two consecutive write cycles are to the same physical target device, and then eliminates turnaround cycles for this type of write operation. This technique for eliminating turnaround cycles for back-to-back writes has been incorporated into version 2.0 of the PCI specification. The '703 patent, however, also explicitly excludes read cycles as candidates for fast back-to-back transfers.

The industry solution to the turnaround cycle problem has another drawback; specifically, write throughput is different from read throughput. Since certain software applications require symmetrical read and write rates, it is necessary to slow the write rate down to equal that of the slower read rate. However, the calculation of the different read and write rates in software is not a trivial problem. Thus, it is desirable for the read throughput and the write throughput to be the same.

Contention is particularly problematic on a multiplexed address/data bus when an initiator device performs a read operation on a register in a target device. Since the initiator device places the address information on the address/data lines first, followed by the target device driving the register data onto the same address/data lines, a turnaround or wait cycle is inserted between the address cycle and the data cycle to prevent contention between the driver circuits in the initiator and the driver circuits in the target. Furthermore, for conventional back-to-back read operations, a turnaround cycle must also be inserted after the target device places data on the address/data lines to separate the previous data cycle from the next address cycle.

Accordingly, the invention described below is a 5 state bus driver that is useful for eliminating bus turnaround cycles, not only for back-to-back writes, but also for back-to-back reads. The elimination of turnaround cycles not only doubles the data throughput for back-to-back read operations, but also makes the data throughput for fast back-to-back read operations equal to the data throughput for fast back-to-back write operations.

One application of the current invention is described in a related patent application Ser. No. 09/162,600 (attorney docket No. RP9-98-057), which was filed on the same date as this application. This co-pending application, which is incorporated into this application by reference, is entitled "Elimination Of Turnaround Cycles On Multiplexed Address/Data Buses."

SUMMARY OF THE INVENTION

Briefly, the invention is a multi-state driver having at least four output states. The driver includes a data input for receiving a data signal having first and second logical states, a clock input for receiving a clock signal having first and second logical states, and a data output. An output circuit is coupled to the data output and includes four selectable output states. The first output state is a voltage mode state having a low output voltage and a low output impedance, the second output state is a current mode state having a low output voltage and a high output impedance, the third output state is a voltage mode state having a high output voltage and a low output impedance, and the fourth output state is a current mode state having a high output voltage and a high output impedance. An input circuit is coupled to the data input, the clock input, and the output circuit. The input circuit causes the first output state to be selected in response to the data signal being in the first state and the clock signal being in the first state. The input circuit causes the second output state to be selected in response to the data signal being in the first state and the clock signal being in the second state. The input circuit causes the third output state to be selected in response to the data signal being in the second state and the clock signal being in the first state. And the input circuit causes the fourth output state to be selected in response to the data signal being in the second state and the clock signal being in the second state.

In another embodiment, the invention is an adapter for attachment to a bus having a clock line for carrying a clock signal and at least one data line for carrying a data signal. The clock and data signals on the bus each have first and second logical states. The adapter includes a connector for coupling the adapter to the bus, a processing circuit for generating the data signal and a driver circuit coupled between the processing circuitry and the connector. The driver circuit includes a data input for receiving the data signal from the processing circuit, a clock input for receiving the clock signal from the bus, and a data output for driving the data signal onto the data line of the bus. An output circuit is coupled to the data output and includes four selectable output states. The first output state is a voltage mode state having a low output voltage and a low output impedance. The second output state is a current mode state having a low output voltage and a high output impedance. The third output state is a voltage mode state having a high output voltage and a low output impedance. And the fourth output state is a current mode state having a high output voltage and a high output impedance. An input circuit is coupled to the data input, the clock input, and the output circuit. The input circuit causes the first output state to be selected in response to the data signal being in the first state and the clock signal being in the first state. The input circuit causes the second output state to be selected in response to the data signal being in the first state and the clock signal being in the second state. The input circuit causes the third output state to be selected in response to the data signal being in the second state and the clock signal being in the first state. And the input circuit causes the fourth output state to be selected in response to the data signal being in the second state and the clock signal being in the second state.

In yet another embodiment, the invention is a computer system including a bus having a clock line for carrying a clock signal and at least one data line for carrying a data signal. The clock signal and the data signal each have first and second logical states. The computer system also includes first and second devices coupled to the bus, wherein each of the first and second devices includes processing circuitry for generating the data signal on the bus and a driver circuit coupled between the processing circuitry and the bus. The driver circuit includes a data input for receiving the data signal from the processing circuit, a clock input for receiving the clock signal from the bus, and a data output for driving the data signal onto the data line of the bus. An output circuit is coupled to the data output and includes four selectable output states. The first output state is a voltage mode state having a low output voltage and a low output impedance. The second output state is a current mode state having a low output voltage and a high output impedance. The third output state is a voltage mode state having a high output voltage and a low output impedance. And the fourth output state is a current mode state having a high output voltage and a high output impedance. An input circuit is coupled to the data input, the clock input, and the output circuit. The input circuit causes the first output state to be selected in response to the data signal being in the first state and the clock signal being in the first state. The input circuit causes the second output state to be selected in response to the data signal being in the first state and the clock signal being in the second state. The input circuit causes the third output state to be selected in response to the data signal being in the second state and the clock signal being in the first state. And the input circuit causes the fourth output state to be selected in response to the data signal being in the second state and the clock signal being in the second state.

DESCRIPTION OF A PREFERRED EMBODIMENT

Figure 1:
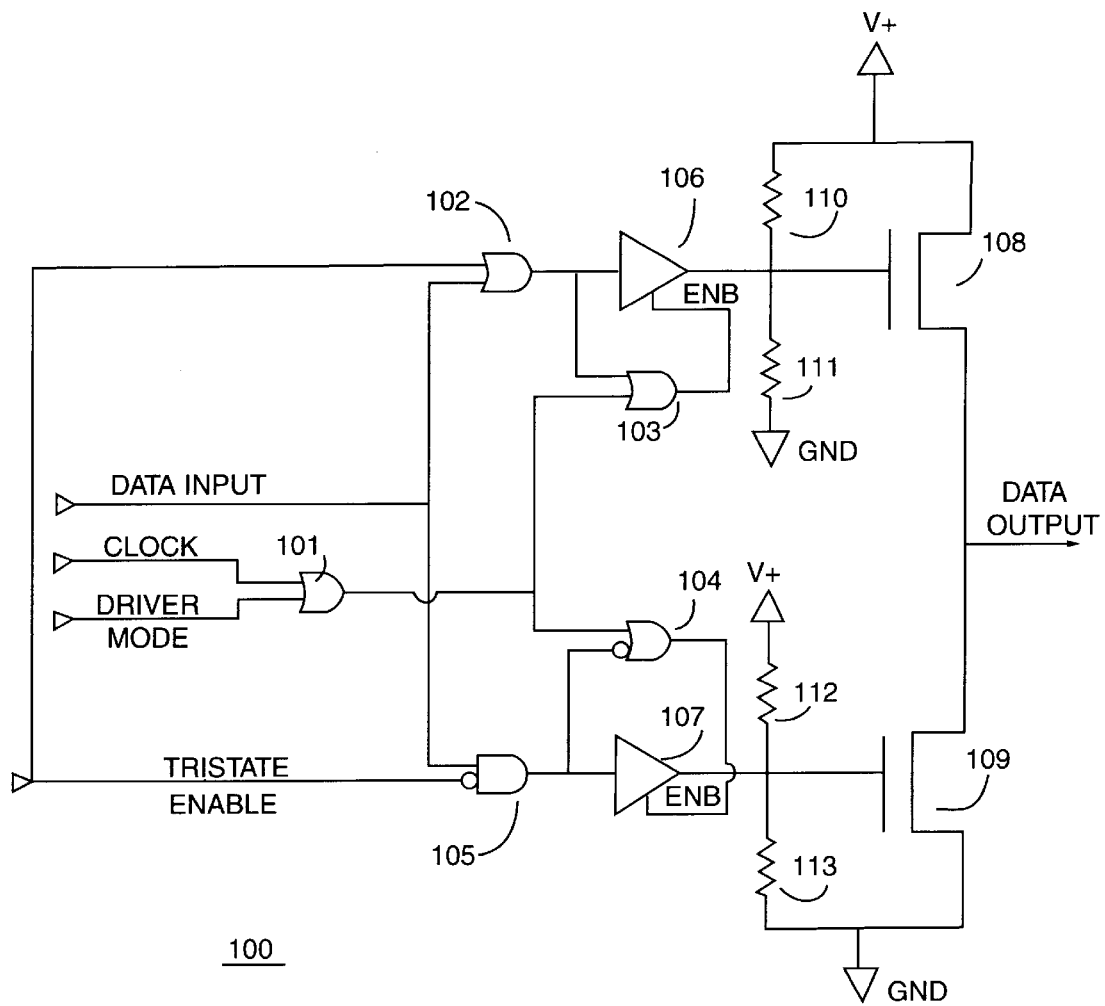
FIG. 1 is a schematic diagram of an exemplary embodiment of the 5 bus driver.

Referring to FIG. 1 wherein a schematic diagram of 5 State Driver 100 is illustrated, the output of a two input OR gate 101 is coupled to one input of two input OR gate 103 and to the non-inverting input of OR gate 104 (OR gate 104 has one non-inverting and one inverting input). A clock signal and a driver mode signal (both external to Driver 100) are coupled to the input of OR gate 101 on Clock and Driver Mode Lines, respectively. A data signal, external to Driver 100, is coupled to one input of a two input OR gate 102 and to the non-inverting input of a two input AND gate 105 (the other input of AND gate 105 is inverting) via a Data Line. A Hi-Z enable signal (external to Driver 100) is coupled to the other input of OR gate 102 and to the inverting input of AND gate 105 on a Hi-Z Enable Line.

The output of OR gate 102 is coupled to the input of Buffer 106 and also to the other input of OR gate 103. The output of OR gate 103 is coupled to an "enable" input ("ENB") of Buffer 106. When the enable input of Buffer 106 is asserted (logical 1), it causes the output of Buffer 106 to go into a high impedance mode. Similarly, the output of AND gate 105 is coupled to the input of Buffer 107 and also to the inverting input of OR gate 104. The output of OR gate 104 is coupled to the enable input ("ENB") of Buffer 107.

The output of Buffer 106 is coupled to the gate of a p-channel, enhancement mode, field effect transistor (FET) 108. One end of each resistor 110 and 111 is coupled to the gate of Transistor 108, the other end of resistor 110 is coupled to the positive power supply terminal V+, and the other end of resistor 111 is coupled to the negative power supply terminal "GND." Thus, resistors 110 and 111 form a voltage divider that, when the output of Buffer 106 is disabled (ENB=logical 0), places a voltage on the gate of Transistor 108 that is sufficient to turn the transistor ON "soft." In other words, such that the drain-to-source impedance of Transistor 108 is high, but not as high as when the transistor is turned OFF. In the alternative, one resistor coupled between the gate of the transistor and a reference voltage source (having a voltage less than V+) could be substituted for the two voltage divider resistors. The actual drain-to-source impedance when the transistor is turned on "soft" will vary with the application, but an impedance of 600 Ohms appears suitable for driving a line of the PCI bus. The source of Transistor 108 is coupled to V+ and the drain is coupled to a Data Output Line.

The output of Buffer 107 is coupled to the gate of an n-channel, enhancement mode, field effect transistor (FET) 109. One end of each resistor 112 and 113 is coupled to the gate of Transistor 109, the other end of resistor 112 is coupled to V+, and the other end of resistor 113 is coupled to GND. Thus, resistors 112 and 113 form a voltage divider that, when the output of Buffer 107 is disabled, places a voltage on the gate of Transistor 109 that is sufficient to turn the transistor ON soft. The source of Transistor 109 is coupled to GND and the drain is coupled to the Data Output Line.

OPERATION

There are two fundamental modes of operation for driver 100. The first mode of operation is a conventional 3 state mode, which is selected by setting the Driver Mode Line to a logical 1. With the Driver Mode Line set to a logical 1, the output of OR gate 101 will also be a logical 1 which, in turn, will drive the output of OR gates 103 and 104 to a logical 1, thereby enabling Buffers 106 and 107.

The conventional 3 state mode of operation has the following three states, wherein "–" signifies "don't care" and "Hi Z" signifies very high impedance:

| DATA INPUT | Hi-Z ENABLE | DRIVER OUTPUT |
| --- | --- | --- |
| 0 | 0 | 1 |
| 1 | 0 | 0 |
| – | 1 | Hi Z |

When the Hi-Z Enable Line is disabled (logical 0), data on the Data Input Line passes through OR gate 102 and appears at the output of Buffer 106 uninverted. Similarly, data passes through AND gate 105 and appears at the output of Buffer 107 uninverted. When the Data Input Line is low (logical 0), a logical 0 appears at the output of Buffers 106 and 107, thereby turning Transistor 108 ON and Transistor 109 OFF, which pulls the Data Output Line high (Driver 100 is an inverting driver; therefore, the signal on the Data Output Line is inverted relative to the signal on the Data Input Line). Similarly, when the Data Input Line is high (logical 1), a logical 1 appears at the output of Buffers 106 and 107, thereby turning Transistor 108 OFF and Transistor 109 ON, which pulls the Data Output Line low.

When the Hi-Z Enable Line is enabled (logical 1), a logical 0 appears at the output of AND gate 105, which causes the output of OR gate 104 to go to a logical 1, thereby enabling Buffer 107. With a logical 0 at the output of AND gate 105 and Buffer 107 enabled, the output of Buffer 107 is also a logical 0, thereby turning Transistor 109 OFF (i.e., very high drain-to-source impedance). Similarly, when the Hi-Z Enable Line is enabled (logical 1), the outputs of OR gates 102 and 103 are driven to a logical 1 state, thereby enabling Buffer 106. Since the input to Buffer 106 is a logical 1, its output also goes to the logical 1 state, thereby turning Transistor 108 OFF (i.e., very high drain-to-source impedance). Consequently, both Transistors 108 and 109 are driven to the OFF or very high impedance state, thereby placing the Data Output in a very high impedance or "Hi-Z" mode.

The second mode of operation is a 5 mode, which is selected by setting the Driver Mode Line to a logical 0. The 5 mode of operation has the following five states, wherein "–" signifies "don't care", "Hi Z" signifies very high impedance, "V" signifies voltage mode and "I" signifies current mode:

| DATA INPUT | Hi-Z ENABLE | CLOCK | DRIVER OUTPUT |
| --- | --- | --- | --- |
| 0 | 0 | 1 | 1 (V) |
| 0 | 0 | 0 | 1 (I) |
| 1 | 0 | 1 | 0 (V) |
| 1 | 0 | 0 | 0 (I) |
| – | 1 | – | Hi Z |

When the Hi-Z Enable Line is enabled (logical 1), Driver 100 functions as described above with reference to the conventional 3 state mode of operation. In other words, the Data Output Line is placed in the "Hi-Z" or very high impedance state whenever the Hi-Z Enable Line is enabled. Unless otherwise indicated, the remainder of this description of the operation of the 5 mode assumes that the Hi-Z Enable Line has been disabled (logical 0). With the Hi-Z Enable Line disabled (logical 0), the data signal at the Data Input Line appears at the output of OR gate 102 and AND gate 105.

With the Driver Mode set to a logical 0, the clock signal (on the Clock Line) appears at the output of OR gate 101. Consequently, Buffers 106 and 107 are enabled through OR gates 103 and 104 whenever the clock signal is high (logical 1), and Driver 100 functions as described above with reference to the conventional 3 state mode of operation. In other words, when the clock signal is a logical 1, the signal at the Data Output is a "voltage mode" signal that is inverted relative to the signal on the Data Input Line. A "voltage mode" signal indicates that one of the two Transistors 108 or 109 is turned ON "hard", such that the drain-to-source impedance of the transistor is very low (e.g., 30 Ohms). In contrast, a "current mode" signal will be described below in which one of the two Transistors is turned ON "soft", such that the drain-to-source impedance of the transistor is high, but not as high as it is in the Hi-Z or very high impedance mode described above. "Voltage mode" and "current mode" are indicated in the table above by the symbols "V" and "I", respectively. The conventional 3 state mode of operation only uses the voltage and Hi-Z modes, while the 5 mode of operation uses all three modes; voltage, current and Hi-Z.

With the 5 mode selected (Driver Mode set to logical 0) and the Hi-Z Enable Line disabled (logical 0), Driver 100 functions in a current mode whenever the clock signal is in the logical 0 state. Since the Driver Mode and the Hi-Z Enable Lines are both in the logical 0 state, the signal on the Data Input Line appears at the input of Buffers 106 and 107, and at the enable ("ENB") input to Buffer 106. An inverted data signal appears at the enable ("ENB") input to Buffer 107. Consequently, when the data signal at the Data Input is a logical 0, Buffer 107 is enabled and its output is in the logical 0 state, thereby switching Transistor 109 OFF (very high drain-to-source impedance). Buffer 106, however, is disabled, thereby allowing the gate bias resistors 110 and 111 to switch Transistor 108 ON "soft" and pull the Data Output to a logical 1 state through a high drain-to-source impedance (but not as high as when the transistor is switched OFF). Similarly, when the data signal at the Data Input is a logical 1, Buffer 106 is enabled and its output is a logical 1, thereby switching Transistor 108 OFF (very high drain-to-source impedance). Buffer 107, however, is disabled, thereby allowing the gate bias resistors 112 and 113 to switch Transistor 109 ON "soft" and pull the Data Output to a logical 0 state through a high drain-to-source impedance (but not as high as when the transistor is switched OFF). In summary, the Data Output of Driver 100 is in the voltage mode (low output impedance) when the clock signal is in logical 1 state, and the Data Output is in the current mode (high output impedance) when the clock signal is in the logical 0 state.

What has been described above is one exemplary embodiment of a 5 driver. Those skilled in the art will understand that other implementations are possible and within the scope of the invention as claimed below.

What is claimed is:

1. A multi-state driver having at least four output states, said multi-state driver comprising:

a data input for receiving a data signal having first and second logical states, a clock input for receiving a clock signal having first and second logical states, and a data output;

an output circuit coupled to said data output and having four selectable output states: the first output state being a voltage mode state having a low output voltage and a low output impedance, the second output state being a current mode state having a low output voltage and a high output impedance, the third output state being a voltage mode state having a high output voltage and a low output impedance, and the fourth output state being a current mode state having a high output voltage and a high output impedance; and an input circuit coupled to said data input, said clock input, and said output circuit, said input circuit causing the first output state to be selected in response to the data signal being in the first state and the clock signal being in the first state, said input circuit causing the second output state to be selected in response to the data signal being in the first state and the clock signal being in the second state, said input circuit causing the third output state to be selected in response to the data signal being in the second state and the clock signal being in the first state, said input circuit causing the fourth output state to be selected in response to the data signal being in the second state and the clock signal being in the second state.

2. The multi-state driver of claim 1, further comprising:

a high impedance enable input for receiving a high impedance enable signal having enabled and disabled logical states;

said output circuit also having a selectable fifth output state, the fifth output state being a high impedance mode having high output impedance; and said input circuit also being coupled to said high impedance enable input, said input circuit causing the fifth state to be selected in response to the high impedance enable signal being in the enabled state.

3. An adapter for attachment to a bus having a clock line for carrying a clock signal and at least one data line for carrying a data signal, the clock signal and the data signal each having first and second logical states, said adapter comprising:

a connector for coupling said adapter to the bus;

a processing circuit for generating the data signal;

a driver circuit coupled between said processing circuitry and said connector, said driver circuit including:

a data input for receiving the data signal from said processing circuit, a clock input for receiving the clock signal from the bus, and a data output for driving the data signal onto the data line of the bus;

an output circuit coupled to said data output and having four selectable output states: the first output state being a voltage mode state having a low output voltage and a low output impedance, the second output state being a current mode state having a low output voltage and a high output impedance, the third output state being a voltage mode state having a high output voltage and a low output impedance, and the fourth output state being a current mode state having a high output voltage and a high output impedance; and an input circuit coupled to said data input, said clock input, and said output circuit, said input circuit causing the first output state to be selected in response to the data signal being in the first state and the clock signal being in the first state, said input circuit causing the second output state to be selected in response to the data signal being in the first state and the clock signal being in the second state, said input circuit causing the third output state to be selected in response to the data signal being in the second state and the clock signal being in the first state, said input circuit causing the fourth output state to be selected in response to the data signal being in the second state and the clock signal being in the second state.

4. The adapter of claim 3, wherein said driver circuit further comprises:

a high impedance enable input for receiving a high impedance enable signal from said processing circuit, the high impedance enable signal having enabled and disabled logical states;

said output circuit also having a selectable fifth output state, the fifth output state being a high impedance mode having high output impedance; and said input circuit also being coupled to said high impedance enable input, said input circuit causing the fifth state to be selected in response to the high impedance enable signal being in the enabled state.

5. A computer system, comprising:

a bus having a clock line for carrying a clock signal and at least one data line for carrying a data signal, the clock signal and the data signal each having first and second logical states;

first and second devices coupled to said bus, each of said first and second devices including processing circuitry for generating the data signal on said bus and including a driver circuit coupled between said processing circuitry and said bus, said driver circuit including:

a data input for receiving the data signal from said processing circuit, a clock input for receiving the clock signal from the bus, and a data output for driving the data signal onto the data line of the bus;

an output circuit coupled to said data output and having four selectable output states: the first output state being a voltage mode state having a low output voltage and a low output impedance, the second output state being a current mode state having a low output voltage and a high output impedance, the third output state being a voltage mode state having a high output voltage and a low output impedance, and the fourth output state being a current mode state having a high output voltage and a high output impedance; and an input circuit coupled to said data input, said clock input, and said output circuit, said input circuit causing the first output state to be selected in response to the data signal being in the first state and the clock signal being in the first state, said input circuit causing the second output state to be selected in response to the data signal being in the first state and the clock signal being in the second state, said input circuit causing the third output state to be selected in response to the data signal being in the second state and the clock signal being in the first state, said input circuit causing the fourth output state to be selected in response to the data signal being in the second state and the clock signal being in the second state.

6. The computer system of claim 5, wherein said driver circuit further comprises:

a high impedance enable input for receiving a high impedance enable signal from said processing circuit, the high impedance enable signal having enabled and disabled logical states;

said output circuit also having a selectable fifth output state, the fifth output state being a high impedance mode having high output impedance; and said input circuit also being coupled to said high impedance enable input, said input circuit causing the fifth state to be selected in response to the high impedance enable signal being in the enabled state.

7. The computer system of claim 5, wherein one of said first and second devices is a bus bridge.

* * * * *